United States Patent [19]

Ohsima

[11] Patent Number: 5,034,798
[45] Date of Patent: Jul. 23, 1991

[54] SEMICONDUCTOR DEVICE HAVING A TWO-LAYER GATE STRUCTURE

[75] Inventor: Yohichi Ohsima, Yokohama, Japan

[73] Assignee: Kabushiki Kaisha Toshiba, Kawasaki, Japan

[21] Appl. No.: 612,466

[22] Filed: Nov. 14, 1990

Related U.S. Application Data

[63] Continuation of Ser. No. 226,098, Jul. 29, 1988.

[30] Foreign Application Priority Data

Jul. 31, 1987 [JP] Japan .................................. 62-191548

[51] Int. Cl.$^5$ ...................... H01L 49/02; H01L 29/68; H01L 29/78; H01L 29/34
[52] U.S. Cl. .......................................... 357/54; 357/6; 357/23.5; 357/23.15
[58] Field of Search ...................... 357/6, 23.15, 23.14, 357/23.5, 54

[56] References Cited

U.S. PATENT DOCUMENTS

| | | | |
|---|---|---|---|
| 3,992,701 | 11/1976 | Abbas et al. | 357/23.5 |
| 4,495,693 | 8/1985 | Iwahashi et al. | 357/23.5 |
| 4,630,086 | 12/1986 | Sato et al. | 357/23.5 |
| 4,683,554 | 7/1987 | Lockwood et al. | 357/23.5 |

OTHER PUBLICATIONS

T. C. Penn, "New Methods of Processing Silicon Series", Science, vol. 208 (May 1980) pp. 923-926.

*Primary Examiner*—J. Carroll
*Attorney, Agent, or Firm*—Finnegan, Henderson, Farabow, Garrett, and Dunner

[57] ABSTRACT

A semiconductor device is disclosed, which comprises source and drain regions formed in a spaced-apart relation to each other on an isolated semiconductor substrate surface, a first conductive layer formed over a channel region between the source and drain regions via a gate insulating film and serving as a floating gate electrode, a two-layer insulating layer formed on the first conductive layer and consisting of a silicon oxynitride film and a silicon oxide film, and a second conductive layer formed on the two-layer insulating layer and serving as a control gate electrode. In the semiconductor device of this structure, the silicon oxynitride film traps fewer electrons, and electrons are infrequently trapped at the time of data erasing, so that data-erasing characteristics can be improved. Further, since fewer electrons are trapped, unlike the prior art insulating layer utilizing a silicon nitride film, there is no need for providing any silicon oxide film on each side, and with the two-layer structure consiting of the silicon oxynitride film and a silicon oxide film it is possible to obtain sufficient insulation and film thickness reduction.

3 Claims, 6 Drawing Sheets

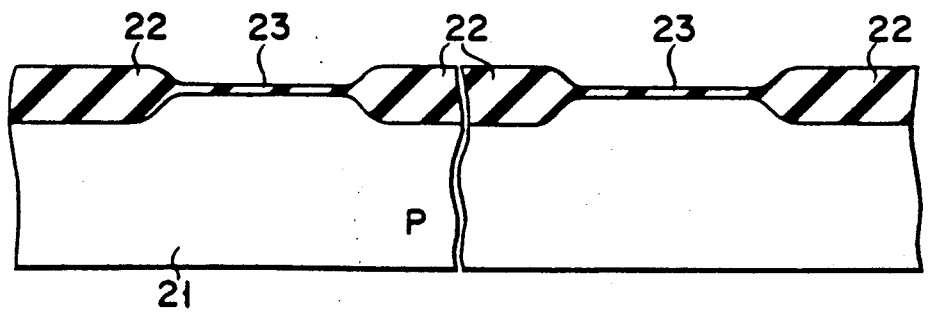
F I G. 2A

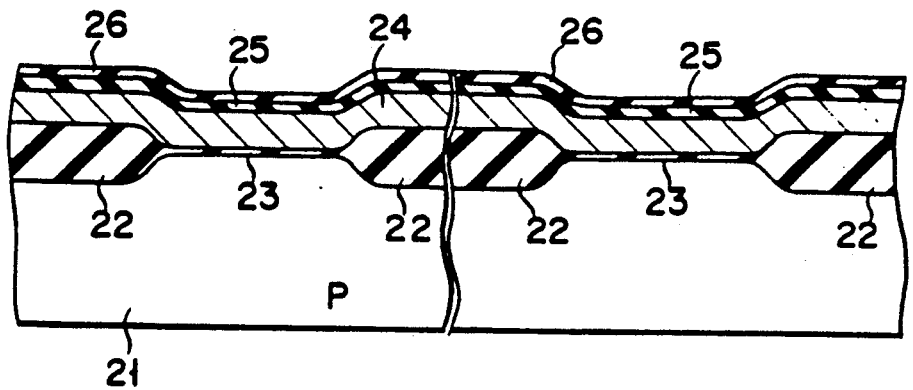
F I G. 2B
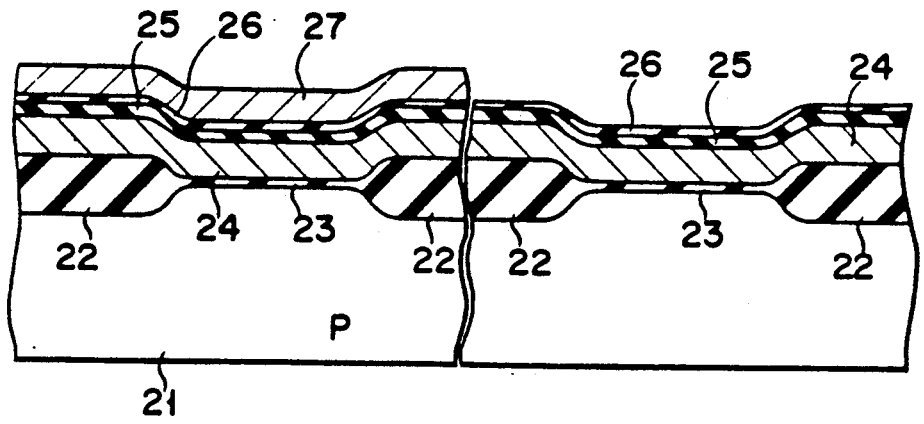
F I G. 2C
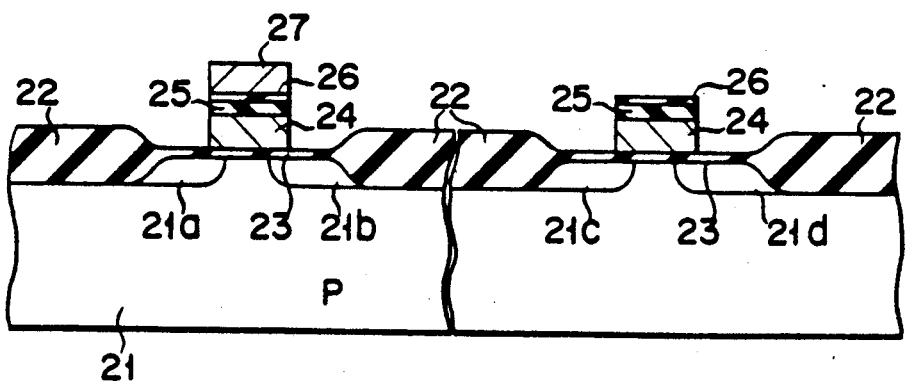
F I G. 2D

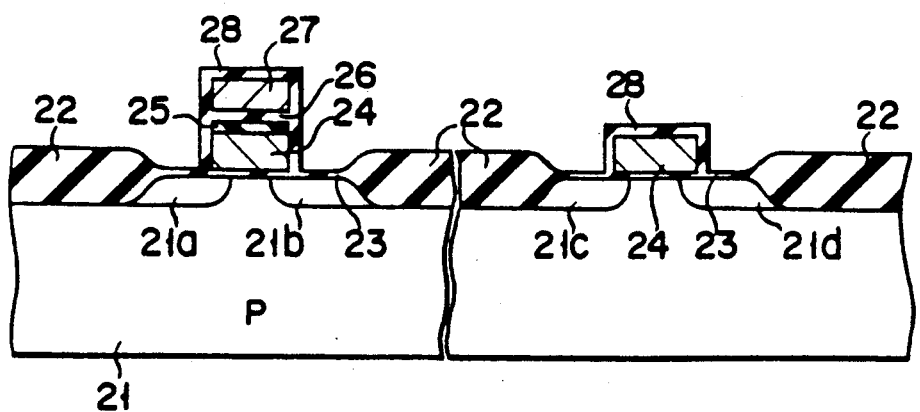
F I G. 2E
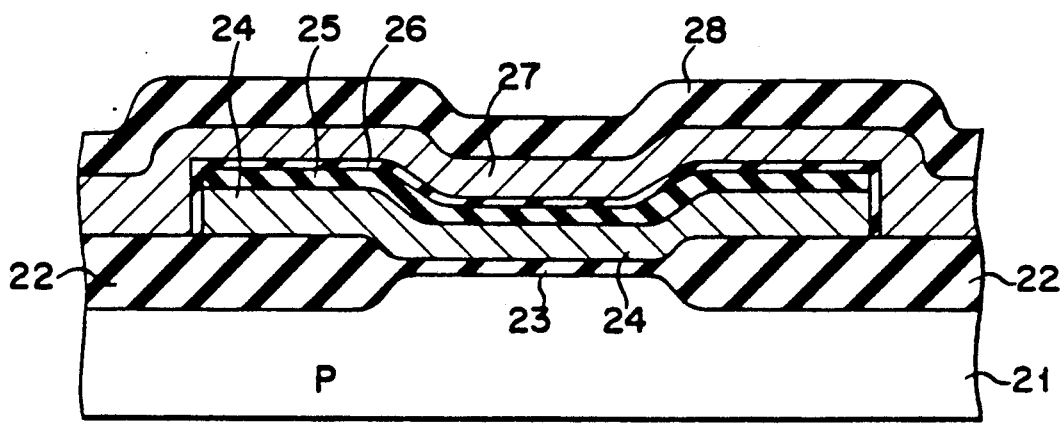
F I G. 3
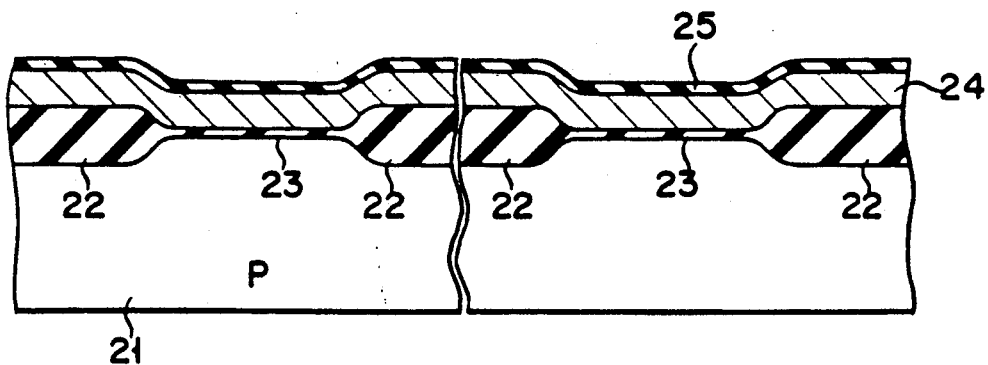
F I G. 4A

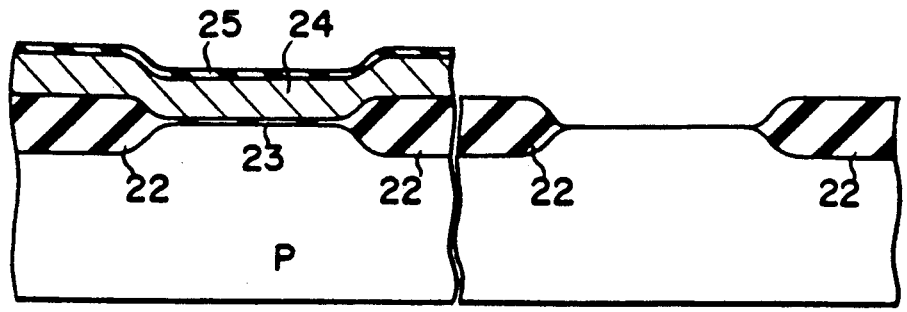
F I G. 4B
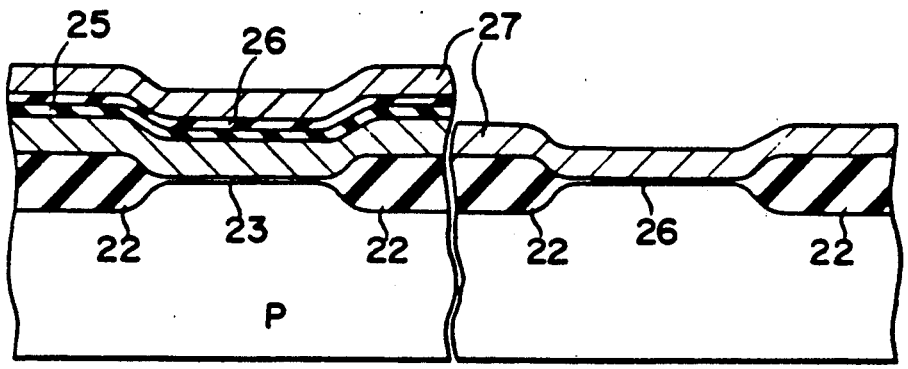
F I G. 4C
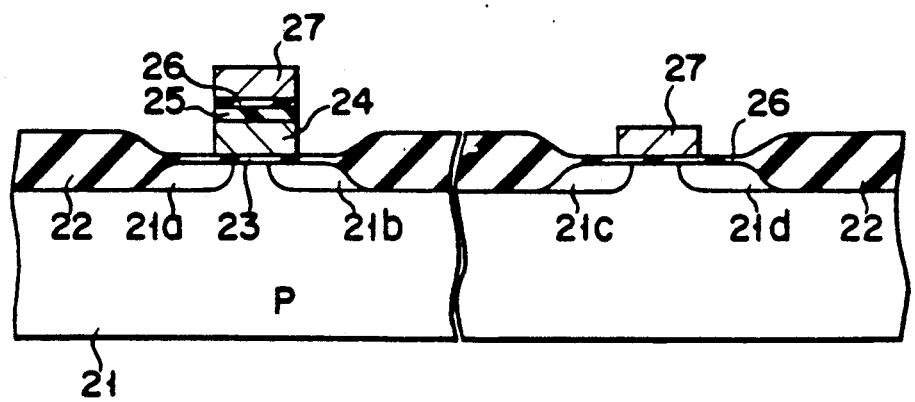
F I G. 4D

SEMICONDUCTOR DEVICE HAVING A TWO-LAYER GATE STRUCTURE

This is a continuation of application Ser. No. 07/226,098, filed July 29, 1988.

BACKGROUND OF THE INVENTION

1. Field of the Invention

This invention relates to a semiconductor device and, more particularly, to a semiconductor device having a two-layer gate structure having a floating gate electrode and a control gate electrode.

2. Description of the Related Art

A semiconductor device having a two-layer gate structure having a floating gate electrode and a control gate electrode, e.g., EPROM, has a structure as shown in FIGS. 1A and 1B.

FIGS. 1A and 1B are sectional views of a semiconductor device, taken perpendicular to each other. This device comprises P-type semiconductor substrate 101, which has N-type source and drain regions 102 and 103 formed in surface regions thereof. Gate insulating film 106 is formed on channel region 104, which extends between source and drain regions 102 and 103, and as is shown in FIG. 1B, channel region 104 is isolated by field insulating layer 105. Floating gate electrode 107, consisting of polycrystalline silicon, for example, is formed on gate insulating film 106, and silicon oxide ($SiO_2$) film 108 is formed on electrode 107, by thermal oxidation thereof. Silicon nitride ($Si_3N_4$) film 109 is formed on silicon oxide film 108, with silicon oxide film 110, in turn, being formed on film 109. Control gate electrode 111, consisting of polycrystalline silicon, is formed over floating gate electrode 107 via the three-layer insulating film consisting of silicon oxide film 108, silicon nitride film 109, and silicon oxide film 110.

The entire surface of the system, inclusive of control gate electrode 11, is then covered by insulating layer 112; for example, a silicon oxide film. In addition, although not shown, contact holes and aluminum leads are provided.

In the semiconductor device of the above structure, floating gate electrode 107 is in an electrically floating state. Therefore, when a high voltage is applied to control gate electrode 111, an electric field is generated in gate insulating film 106 due to coupling between control and floating gate electrodes 111 and 107 and coupling between floating gate electrode 107 and channel region 104. At the same time, by applying a high voltage to drain region 103 hot electrons are generated in channel region 104 near the drain region. These hot electrons are injected into floating gate electrode 107 to obtain a state in which data stored.

In this state, a high electric field is generated between control and floating gate electrodes 111 and 107. This means that an insulating film having a high breakdown voltage is required. For reducing the device size, on the other hand, reduction of the thickness of the insulating film is required.

In the semiconductor device noted above, the insulating film between control and floating gate electrodes 111 and 107 has a three-layer structure consisting of silicon oxide film 108, silicon nitride film 109 and silicon oxide film 110. The three-layer insulating film, compared to a single-layer insulating film, e.g., a silicon oxide film, has superior breakdown voltage for the same film thickness, so that it is advantageous over the single-layer film for thickness reduction. Even with the three-layer insulating film consisting of silicon oxide film 108, silicon nitride film 109 and silicon oxide film 110, there is a limitation imposed on the lower limit of the film thickness. More specifically, if the film thickness of silicon oxide layers 108 and 110 is less than 30 to 40 angstroms, a phenomenon of tunneling occurs, i.e., holes penetrate silicon oxide films 108 and 110. For this reason, silicon oxide films 108 and 110 should have a thickness of at least 40 angstroms. Further, if silicon nitride film 109 has an insufficient thickness, floating gate electrode 107 extending beneath film 109 is oxidized when forming silicon oxide film 110 by oxidation. For this reason, silicon nitride film 109 should have a thickness of at least 60 to 80 angstroms. Therefore, the three-layer insulating film should inevitably have a thickness of 140 to 160 angstroms.

In a further aspect, silicon nitride film 109, although excellent in regard to breakdown voltage, is very liable to capture electrons. Therefore, a failure in the erasing of data by ultraviolet ray illumination sometimes occurs, leading to deterioration of the erasing characteristics.

SUMMARY OF THE INVENTION

An object of the invention is to provide a semiconductor device which permits thickness reduction of the insulating film between the control and floating gate electrodes and precludes the drawback of deterioration of the erasing characteristics due to the use of the prior art silicon nitride film, thus permitting improvements in erasing characteristics.

According to the invention, there is provided a semiconductor device, which comprises source and drain regions formed in a spaced-apart relation to each other in an isolated semiconductor substrate surface region, a first conductive layer formed over a channel region between the source and drain regions via a gate insulating film and constituting a floating gate electrode, a second insulating film formed on the first conductive layer and having a two-layer structure consisting of a silicon oxynitride film and a silicon oxide film, and a second conductive layer formed on the second insulating film and constituting a control gate electrode.

In the semiconductor device of this structure, the silicon oxynitride film traps fewer electrons, and electrons are infrequently trapped at the time of data erasing, so that it is possible to improve the erasing characteristics. Further, since fewer electrons are trapped, unlike the prior art insulating film utilizing the silicon nitride film, there is no need for providing any silicon oxide film on each side, and the two-layer structure consisting of the silicon film and silicon oxide film permits obtaining sufficient insulation and thickness reduction.

BRIEF DESCRIPTION OF THE DRAWINGS

FIGS. 2A to 2E are sectional views showing steps of manufacture of a semiconductor device according to the invention;

FIG. 3 is a sectional view taken along a plane perpendicular to the plane of FIGS. 2A to 2E showing the semiconductor device according to the invention;

FIGS. 4A to 4E are sectional views showing steps of manufacture of a different semiconductor device according to the invention;

DETAILED DESCRIPTION OF THE PREFERRED EMBODIMENTS

Figure 1A:
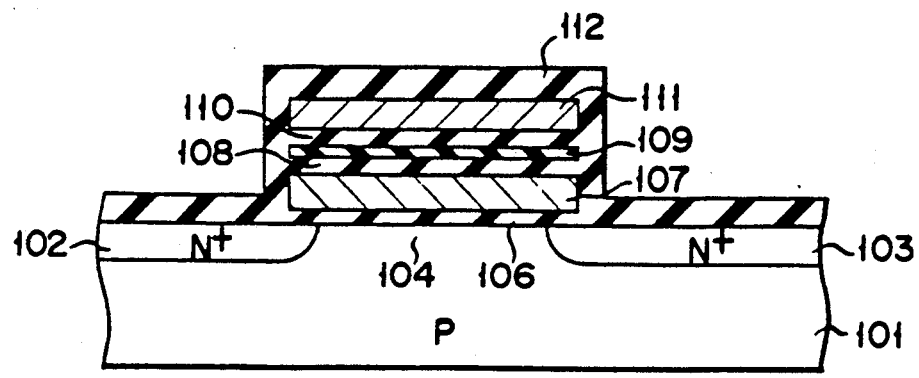
FIG. 1A is a sectional view showing a prior art semiconductor device having a two-layer gate structure having a floating gate electrode and a control gate electrode.
Figure 1B:
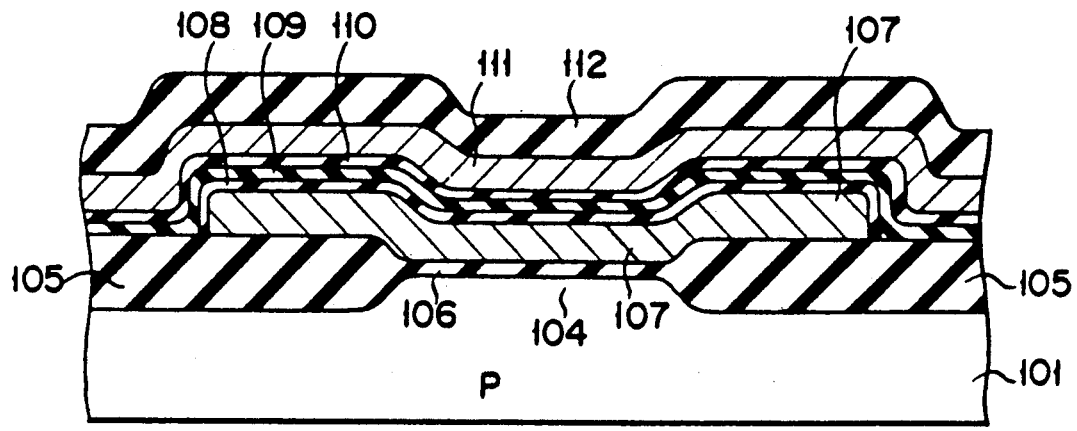
FIG. 1B is a sectional view taken along a plane perpendicular to the plane of section of FIG. 1 and showing the same prior art semiconductor device.

Now, preferred embodiments of the invention will be described with reference to the drawings.

FIGS. 2A to 2E are sectional views for explaining a process of manufacture of one embodiment of the semiconductor device according to the invention.

As shown in FIG. 2A, field insulating layer 22 for element isolation is formed by well-known techniques on the surface of P-type silicon substrate 21, for instance. Gate insulating film 23 is formed by thermal oxidation to a thickness of about 200 angstroms on the surface of semiconductor substrate 21 surrounded by field insulating layer 22.

Then, first polycrystalline silicon layer 24 is deposited to a thickness of approximately 4,000 angstroms on the entire surface of first polycrystalline silicon layer 24 by the CVD process. Subsequently, polycrystalline silicon layer 24 is doped with phosphorus or like impurities by means of ion implantation or thermal diffusion with $POCl_3$ as a source of diffusion. Then, silicon oxynitride ($SiN_XO_Y$) film 25 is deposited to a thickness of approximately 100 angstroms over the entire surface by a LPCVD process, in which $NH_3$, $SiH_2Cl_2$ and $N_2O$ gases are supplied at respective rates of 500, 100 and 250 cc/min. in an atmosphere of 800° C. and 200 Pa. Then, first polycrystalline layer 24 which is to constitute a floating gate electrode of each EPROM cell is patterned in a direction perpendicular to the plane of the Figure (a section taken a plane perpendicular to the plane of FIGS. 2A to 2E being shown in FIG. 3). Then, the surface of $SiN_XO_Y$ film 25 and side surfaces of polycrystalline silicon layer 24 are oxidized by hydrogen combustion oxidation at an oxidation temperature of 950° C.

Then, as shown in FIG. 2C, second polycrystalline silicon layer 27 is deposited over the entire surface by the gas phase growth process, and phosphorus is implanted as an impurity into polycrystalline silicon layer 27. Second polycrystalline silicon layer 27 is removed in a peripheral circuit region, in which no EPROM cell transistor is formed.

Then, as shown in FIG. 2D, silicon oxide film 26, $SiN_XO_Y$ film 25 and polycrystalline silicon layer 24 are successively selectively etched in the peripheral circuit area, in which no transistor is formed, with a resist pattern (not shown) formed as a mark to cover the region, in which the EPROM cell transistor is formed. A transistor pattern is thus formed as shown on the right side of FIG. 2D. Further, in a EPROM cell transistor formation region on the left side of FIG. 2D, which is formed by covering a peripheral circuit transistor formation region of FIG. 2D with a separate resist pattern (not shown), a EPROM cell transistor pattern is formed by successively respectively etching polycrystalline silicon layer 27, silicon oxide layer 26, $SiN_XO_Y$ layer 25 and polycrystalline silicon layer 24. Subsequently, impurity implantation and annealing for the formation of the source and drain regions of the EPROM cell transistor and peripheral circuit transistor are done to form source and drain regions 21a and 21b of the EPROM cell transistor and source and drain regions 21c and 21d of the peripheral circuit transistor.

Then, as shown in FIG. 2E, silicon oxide film 26 and $SiN_XO_Y$ film 25 in the peripheral circuit region are removed using RIE method (Reactive Ion Etching method), and then the entire surface is thermally oxidized to cover polycrystalline silicon films 24 and 27 with silicon oxide film 28.

Then, a thick insulating layer (not shown) is formed over the entire surface by the usual method of manufacture of a MOS semiconductor device, and it is then formed at positions corresponding to the source and drain regions 21a and 21b of the EPROM cell transistor and source and drain regions 21c and 21d of the peripheral circuit transistor with contact holes. Aluminum leads are then formed in these contact holes, thus completing the EPROM cell transistor and peripheral circuit transistor.

As has been shown, in this semiconductor device the insulating film between first polycrystalline silicon layer 24 serving as floating gate electrode and second polycrystalline silicon layer 27 serving as control gate electrode consists of a two-layer structure consisting of $SiN_XO_Y$ layer 25 and silicon oxide film 26. Since the $SiN_XO_Y$ film traps fewer electrons compared to the silicon nitride film, electrons are infrequently trapped compared to the prior art three-layer insulating film, in which a silicon nitride film is sandwiched between opposite side silicon oxide films, so that data-erasing characteristics can be improved. Further, with this semiconductor device, $SiN_XO_Y$ film 25 which traps fewer electrons can prevent injection of electrons from second polycrystalline silicon layer 27 as control gate electrode or first polycrystalline silicon layer 24 as floating gate electrode. Thus, there is no need for forming a three-layer structure as in the prior art, and the thickness of the insulating film can be reduced.

When polycrystalline silicon layer 24 serving as gate electrode is reduced in thickness, at the time of the implantation of an impurity for forming the source and drain regions in the peripheral circuit region, the impurity is liable to penetrate the polycrystalline silicon layer of the electrode into the channel region to result in deterioration of the transistor characteristics. In this semiconductor device, however, the insulating film consisting of $SiN_XO_Y$ film 25 and silicon oxide film 26 is formed on polycrystalline as the gate electrode of the peripheral circuit transistor. Thus, it is possible to prevent injection of impurities into the channel region and thus prevent deterioration of the characteristics of the peripheral circuit transistor. While in this embodiment silicon oxide film 26 is formed on $SiN_XO_Y$ film 25, it is of course possible to form $SiN_XO_Y$ film on silicon oxide film 26.

Now, a different process of manufacture of the semiconductor device, in which the insulating film between the control and floating gate electrodes has a two-layer structure consisting of a $SiN_XO_Y$ film and a silicon oxide film, will be described with reference to FIGS. 4A to 4E.

In the previously mentioned structure, the gate electrode of the peripheral circuit transistor has been formed in a step of forming first polycrystalline silicon layer 24 as a floating gate electrode of the EPROM cell transistor. In this embodiment, the gate electrode of the peripheral circuit transistor is formed in a step of forming second polycrystalline silicon layer 27 as a control gate electrode of the EPROM cell transistor. Now, this process will be described.

As shown in FIG. 4A, field insulating layer 22 and gate insulating film 23 are formed by thermal oxidation on the surface of P-type silicon substrate 21, then first polycrystalline silicon layer 24 is formed by the LPCVD process on insulating films 22 and 23, and then $SiN_xO_Y$ film 25 is formed as in the previous case by the LPCVD process on layer 24.

Then, as shown in FIG. 4B, the region in which the EPROM cell transistor is formed is covered with a resist (not shown), and with this resist as a mask $SiN_xO_Y$ film 25, polycrystalline silicon layer 24 and gate oxide film 23 in the peripheral circuit transistor region are removed. Subsequently, as shown in FIG. 4C, after washing the substrate surface silicon oxide film 26 is formed by thermal oxidization in the peripheral circuit transistor region. This silicon oxide film 26 is utilized as gate insulating film of the peripheral circuit transistor. During this thermal oxidation, silicon oxide film 26 is formed on $SiN_xO_Y$ film 25 of the EPROM cell transistor formation region as well. Subsequently, second polycrystalline silicon layer 27 is deposited by the gas phase growth process in the EPROM cell transistor formation region and peripheral circuit transistor formation region. Phosphorus is then implanted as an impurity into polycrystalline silicon layer 27.

Then, as shown in FIG. 4D, the EPROM cell transistor formation region is covered with a resist pattern (not shown), and with this resist pattern as a mask polycrystalline silicon layer 27 in the peripheral circuit transistor formation region is selectively etched, thus forming a transistor pattern. Then, the peripheral circuit transistor formation region is covered with another resist pattern (not shown), and with this resist pattern as a mask polycrystalline silicon layer 27, silicon oxide layer 26, $SiN_xO_Y$ film 25, silicon oxide film 26 and $SiN_xO_Y$ film and polycrystalline silicon film 24 are successively selectively etched, thus forming a EPROM cell transistor pattern. Then, impurity ion implantation and diffusion are carried out to form source and drain regions 21a and 21b of the EPROM cell transistor and source and drain regions 21c and 21d of the peripheral circuit transistor.

Figure 4E:
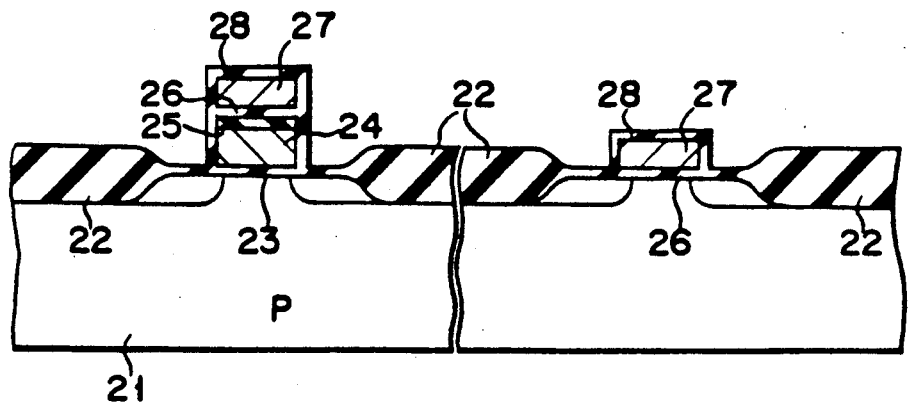

Then, as shown in FIG. 4E, silicon oxide film 28 is formed by thermal oxidation to cover the surface of polycrystalline silicon layers 24 and 27. Then, as in the previous process a thick insulating layer is formed at positions corresponding to source and drain regions 21a and 21b of the EPROM cell transistor and source and drain regions 21c and 21d of the peripheral circuit transistor with contact holes, and aluminum leads are provided through these contact holes, thus completing the semiconductor device.

In this instance, silicon oxide film 26 is formed on $SiN_xO_Y$ film 25. However, it is of course possible to form $SiN_xO_Y$ film 25 on silicon oxide film 26.

In this method of manufacture, gate oxide film 23 of the EPROM cell and gate oxide film 26 of the peripheral circuit transistor are formed in separate steps, so that it is possible to increase the freedom of the device design; for instance, it is possible to vary the thickness of gate oxide film 23 of the EPROM cell transistor and gate oxide film 26 of the peripheral circuit transistor. By providing different thicknesses of gate oxide films 23 and 26 different threshold voltages can be set for the EPROM cell and peripheral circuit transistors. According to the present invention, a transistor having the same structure of the EPROM cell transistor can be formed on the peripheral circuit region, and then the floating gate electrode 24 and control gate electrode 27 of this transistor are shortcircuited. The gate oxide film 23 of this transistor is different in thickness than gate oxide film 26 of the peripheral circuit transistor. Hence, transistors having different threshold voltages are formed on the peripheral circuit region.

Figure 5:
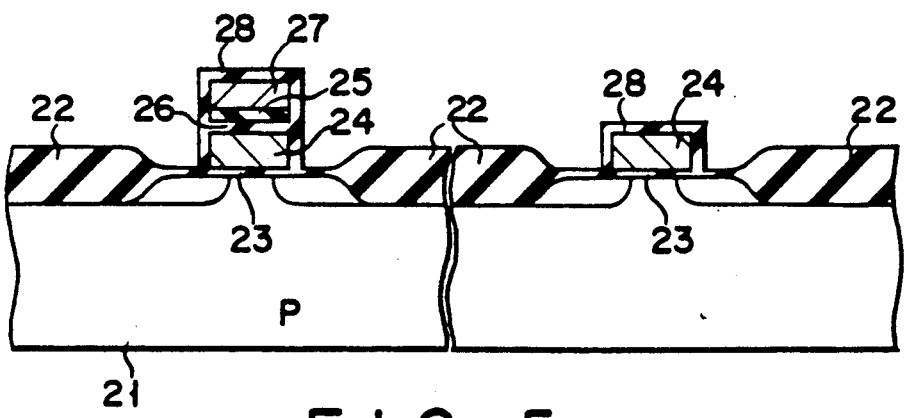
FIG. 5 is a sectional view showing a further embodiment of the semiconductor device according to the invention.

FIG. 5 shows a different embodiment of the semiconductor device according to the invention. In the previous embodiment, the insulating film between floating and control gate electrodes 24 and 27 has been formed such that it has a two-layer structure having $SiN_xO_Y$ film 25 as the lower layer and silicon oxide film 26 as the upper layer. In this embodiment, the insulating film consists of silicon oxide film 26 as the lower layer and $SiN_xO_Y$ film 25 as the upper layer. Further, first polycrystalline silicon layer 24 serving as a floating gate electrode is utilized as a gate electrode of the peripheral circuit transistor.

Figure 6:
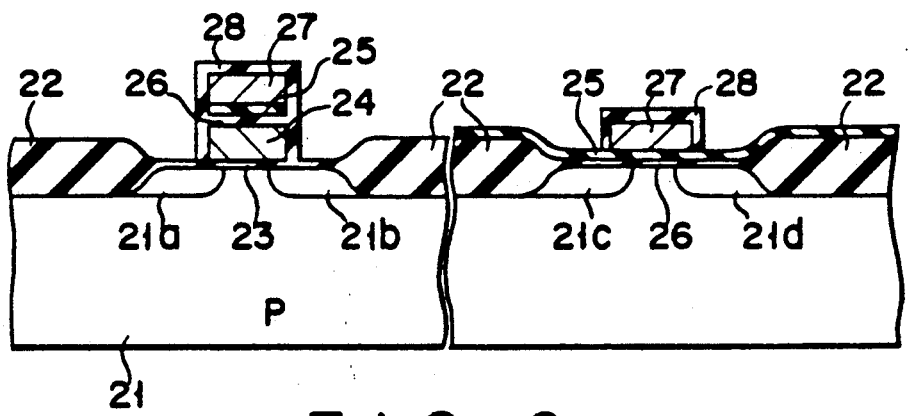
FIG. 6 is a sectional view showing a still further embodiment of the semiconductor device according to the invention.
Figure 7:
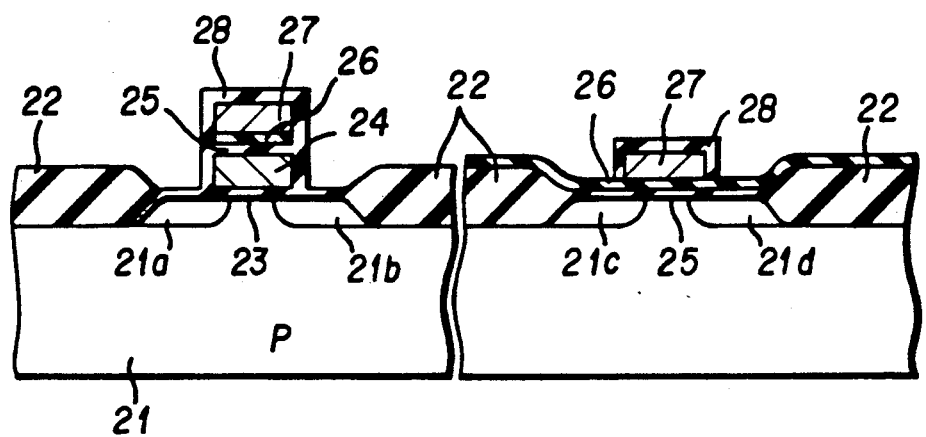
FIG. 7 is a sectional view showing a still further embodiment of the semiconductor device according to the invention.

FIG. 6 shows a further embodiment of the invention. In this instance, while a two-layer insulating film consisting of lower silicon oxide film 26 and upper $SiN_xO_Y$ film 25 are formed, second polycrystalline silicon layer 27 serving as control gate electrode is utilized for the gate electrode of the peripheral circuit transistor. In this case, silicon oxide film 26 and $SiN_xO_Y$ film 25 are utilized as the gate oxide film of the peripheral circuit transistor.

What is claimed is:

1. A semiconductor device comprising:
   source and drain regions formed in a predetermined spaced-apart relation to each other, in a semiconductor substrate surface isolated by a field oxide layer;
   a channel region formed in a semiconductor substrate surface between said source and drain regions;
   a gate insulating film formed on a surface of said semiconductor substrate inclusive of said source, drain, and channel regions;
   a first conductive layer, formed on said gate insulating film;
   a two-layer insulating film consisting of a silicon oxynitride film and a silicon oxide film, wherein said silicon oxynitride film is formed on said silicon oxide film; and
   a second conductive layer, formed on said two-layer insulating film.

2. A semiconductor device comprising:
   a first field oxide layer, formed in a memory cell transistor formation region, and a first gate oxide film of a first transistor, formed in said memory cell transistor formation region;
   a floating gate electrode of said first transistor, formed on said first gate oxide film of said first transistor;
   a two-layer insulating film consisting of a silicon oxynitride film and a silicon oxide film formed on said floating gate electrode, wherein said two-layer insulating film consists of said silicon oxynitride film formed on said silicon oxide film;

a control gate electrode of said first transistor, formed on said two-layer insulating film;

a second field oxide layer of a peripheral circuit transistor formation region and a second gate oxide film of a second transistor, having the same structure as and consisting of the same materials as said two-layer insulating film of said first transistor; and a gate electrode of said second transistor, formed on said second gate oxide film.

3. A semiconductor device comprising:

a first field oxide layer, formed in a memory cell transistor formation region, and a first gate oxide film of a first transistor, formed in said memory cell transistor formation region;

a floating gate electrode of said first transistor, formed on said first gate oxide film of said first transistor;

a two-layer insulating film consisting of a silicon oxynitride film and a silicon oxide film formed on said floating gate electrode, wherein said silicon oxynitride film is formed on said silicon oxide film;

a control gate electrode of said first transistor, formed on said two-layer insulating film;

a second field oxide layer, formed in a peripheral circuit transistor formation region, and a second gate oxide film of a second transistor, consisting of the same materials as said two-layer insulating film of said first transistor; and a gate electrode of said second transistor, formed on said second gate oxide film.

* * * * *